(12) United States Patent
Voutsas et al.

(10) Patent No.: US 6,830,965 B1
(45) Date of Patent: Dec. 14, 2004

(54) SEMICONDUCTOR DEVICE AND A METHOD OF CREATING THE SAME UTILIZING METAL INDUCED CRYSTALLIZATION WHILE SUPPRESSING PARTIAL SOLID PHASE CRYSTALLIZATION

(75) Inventors: Apostolos Voutsas, Portland, OR (US); Yukihiko Nakata, Nara (JP); Takeshi Hosoda, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 88 days.

(21) Appl. No.: 09/696,813

(22) Filed: Oct. 25, 2000

(51) Int. Cl.$^7$ .................... H01L 21/00; H01L 21/84
(52) U.S. Cl. .................. 438/166; 438/482; 438/486
(58) Field of Search ..................... 438/150, 166, 438/482, 486, 149

(56) References Cited

U.S. PATENT DOCUMENTS

| | | | |
|---|---|---|---|
| 5,248,630 A | 9/1993 | Serikawa et al. | 437/101 |
| 5,371,382 A * | 12/1994 | Venkatesan et al. | 257/77 |
| 5,569,610 A * | 10/1996 | Zhang et al. | 437/21 |
| 5,665,210 A | 9/1997 | Yamazaki | 438/3 |
| 5,817,550 A | 10/1998 | Carey et al. | 438/166 |
| 5,940,693 A * | 8/1999 | Maekawa | 438/166 |
| 6,080,643 A | 6/2000 | Noguchi et al. | 438/487 |
| 6,165,875 A * | 12/2000 | Fonash et al. | 438/486 |
| 6,225,197 B1 * | 5/2001 | Maekawa | 438/487 |
| 6,312,979 B1 * | 11/2001 | Jang et al. | 438/166 |
| 6,346,437 B1 * | 2/2002 | Maekawa et al. | 438/166 |
| 6,429,097 B1 * | 8/2002 | Voutsas et al. | 438/478 |
| 6,537,898 B1 | 3/2003 | Lee et al. | 438/486 |
| 6,596,572 B1 * | 7/2003 | Kobori et al. | 438/166 |
| 6,784,034 B1 * | 8/2004 | Choi | 438/164 |
| 2003/0207502 A1 * | 11/2003 | Yamazaki et al. | 438/149 |

OTHER PUBLICATIONS

Article entitled, "Influence of $^{16}$O, $^{12}$C, $^{14}$N, and Noble Gases on the Crystallization of Amorphous Si Layers", published in J. Appl. Phys., vol. 48, by E. F. Kennedy et al., (1977), pp. 4241–4246.

Article entitled, "Microstructure of xenon–implanted silicon", published in J. Vac. Sci. Technol., vol. 12, by S. Mader and K. N. Tu, (1975), pp. 501–503.

Article entitled, "Influence of Surface Absorption Characteristics on Reactively Sputtered Films Grown in the Biased and Unbiased Modes", by H. F. Winters and E. Kay, published in J. Appl. Phys., vol. 43, No. 3, Mar. 1972, pp. 794–799.

* cited by examiner

*Primary Examiner*—David Coleman
*Assistant Examiner*—Khiem Nguyen
(74) *Attorney, Agent, or Firm*—David C. Ripma; Matthew D. Rabdau; Joseph P. Curtin

(57) ABSTRACT

A metal induced crystallization process is provided which employs an amorphous silicon film precursor deposited by physical vapor deposition, wherein the precursor film does not readily undergo crystallization by partial solid phase crystallization. Using this physical vapor deposition amorphous silicon precursor film, the amorphous silicon film is transformed to polysilicon by metal induced crystallization wherein the crystalline growth occurs fastest at regions that have been augmented with a metal catalyst and proceeds extremely slowly, practically zero, at regions which bear no metal catalyst. Accordingly, by use of the physical vapor deposition amorphous silicon precursor film in the process of the present invention, the metal induced crystallization process may take place at higher annealing temperatures and shorter annealing times without solid phase crystallization taking place. The process has a faster throughput than previous metal induced crystallization processes, results in a polysilicon film having virtually no catalyst impurities remaining in the film, and results in a film having uniform material characteristics. The resulting polysilicon film may be utilized in thin film transistors or liquid crystal displays.

15 Claims, 6 Drawing Sheets

| POWER (kW) | PRESSURE (mTorr) | SPUTTERING GAS | Ar CONTENT (at/cm$^3$) |
|---|---|---|---|
| 8 | 14-16 | PURE He | <2X10$^{18}$ |
| | | He/(3.8%)Ar | 2-5X10$^{18}$ |
| | | He/(10%)Ar | 4-7X10$^{18}$ |
| | | PURE Ar | 6X10$^{19}$ |
| 8 | 5-6 | PURE Ar | 2X10$^{20}$ |

SEMICONDUCTOR DEVICE AND A METHOD OF CREATING THE SAME UTILIZING METAL INDUCED CRYSTALLIZATION WHILE SUPPRESSING PARTIAL SOLID PHASE CRYSTALLIZATION

FIELD OF THE INVENTION

This invention relates to a method of depositing a thin film used in the fabrication of polysilicon (p-Si) thin-film-transistors (TFT), and more particularly, to a method of producing a semiconductor device utilizing metal induced crystallization while suppressing partial solid phase crystallization.

BACKGROUND OF THE INVENTION

The demand for smaller electronic consumer products with higher resolution displays spurs continued research and development in the area of liquid crystal displays (LCDs). The primary component of the LCD is the TFT. TFTs typically are fabricated on a transparent substrate such as quartz, glass, or even plastic, and employ a thin film silicon semiconductor.

There are two types of thin film silicon semiconductors; amorphous silicon semiconductors (a-Si) and crystalline silicon conductors, also called polysilicon semiconductors (p-Si). Amorphous silicon semiconductors are most commonly used because they can be fabricated relatively inexpensively through mass production. Polysilicon semiconductors have superior physical properties, such as electrical conductivity, when compared to a-Si semiconductors. Polysilicon semiconductors, however, are more difficult to produce than are a-Si semiconductors. Due to the superior properties of p-Si semiconductors, much research has been focused on improving the process of fabricating p-Si semiconductors.

One method currently under study involves transforming a-Si films to p-Si films by utilizing metal induced crystallization (MIC). The a-Si films used in the processes of the prior art are silicon films deposited by chemical vapor deposition (CVD) techniques, such as plasma enhanced CVD, as known in the art. MIC is a popular method of transforming the chemical vapor deposited a-Si films to p-Si films because the process uses low thermal budgets, i.e., high temperatures and short annealing times, or relatively low temperatures with longer annealing times. This low thermal budget MIC process is important because the glass substrates typically used in LCDs cannot withstand high annealing temperatures and/or long annealing times without deforming or breaking. For example, glass typically breaks or deforms at temperatures of approximately 750° C. Other substrates, such as quartz, which can withstand higher temperatures and longer annealing times, typically are cost prohibitive for use in LCD devices. In the MIC process, a higher annealing temperature is generally desired so as to minimize the required annealing time. Due to the constraint of glass substrates, current MIC processes typically are carried out between 650° C. and 750° C. (the highest temperatures typically allowed without deforming the glass substrate). However, this annealing temperature range constrains the throughput requirements, i.e., the annealing time required, and the conditions of the MIC process. The annealing time and the temperature of the process both effect the material characteristics of the resulting film. Accordingly, a disadvantage of the current MIC process is that the characteristics of the p-Si films created are constrained by the temperature and throughput limitations imposed by the current process.

Another disadvantage of the current MIC process is the problem of partial solid phase crystallization (SPC) in the film. If partial SPC occurs during the MIC process, the material characteristics of the p-Si film will vary significantly across the film. These variations cause significant topological irregularities in the TFT device which hinders its performance. Accordingly, it is desirable to eliminate the SPC growth mode so that MIC will be the only mechanism underlying the silicon phase transformation.

In one method of the prior art MIC process, the metal catalyst is introduced into the film through appropriately positioned windows. These windows typically are positioned surrounding the areas where each TFT is to be fabricated. Accordingly, the metal catalyst is not introduced uniformly in the film, but only at selected areas. Nucleation and crystalline growth commences from these areas first. As the crystalline fronts develop from the sites where the metal catalyst has been introduced, the fronts propagate forward and crystallize sufficiently large regions so as to allow room for fabrication of each TFT device. Outside these regions the silicon material remains in the amorphous phase and is etched, i.e., removed, in subsequent steps.

During propagation of the metal induced crystallization fronts in the film, undesirable random nucleation and growth of silicon, also referred to as SPC, is also possible. Solid phase crystallization can become the dominant crystalline growth mechanism under certain operating conditions. In particular, partial SPC typically occurs at higher crystallization temperatures, i.e., temperatures greater than 700° C., and/or at long crystallization times, i.e., greater than 200 seconds. As stated above, these SPC crystallization temperatures and time frames fall squarely within the desired temperature range of the current MIC process. Accordingly, the occurrence of SPC further limits the crystallization temperature range to below 700° C., which increases the annealing time and lowers the throughput of the current MIC process.

In addition, in the MIC process it is desirable to maximize the lateral growth length of the crystallized portion of the film. In other words, it is desirable to maximize the extent that the crystalline growth front advances before its stops due the depletion of the catalyst originally deposited in the introduction window. Depletion of the catalyst reduces the amount of catalyst left in the film as an impurity. Because the lateral growth length of the crystallized portion is maximized by long annealing times and/or high annealing temperatures, the issue of suppressing partial SPC during the MIC process becomes even more important at the desired annealing temperatures.

Thus far, the solution has been to restrict the operating window of the MIC process to conditions which minimize partial SPC and at the same time attempt to achieve the desirable lateral growth length of the crystalline growth front, i.e., to a length greater than 50 $\mu$m. However, the operating window is quite limiting and interferes with throughput requirements. For example, current MIC processes typically operate at a temperature in a range of 650 to 700° C., with an annealing time of 200 seconds. The film that is created retains a relatively large amount of the metal catalyst as an impurity and has spatial irregularities due to formation of the crystalline structure by both MIC and SPC processes. Increasing the annealing time to over 1000 seconds will eliminate much of the catalyst remaining in the film but will increase the amount of SPC which occurs. Moreover, the 1000 second annealing time is a throughput limitation for the process.

Accordingly, it would be advantageous to have a method of creating a p-Si film having uniform characteristics across the film.

It would also be advantageous to have a method of creating a p-Si film which utilizes metal induced crystallization and which suppresses solid phase crystallization.

It would also be advantageous to have a method of forming a p-Si film by MIC utilizing higher temperatures and shorter annealing times than prior art processes.

It would further be advantageous to have a method of creating a p-Si film in which the metal catalyst is substantially depleted.

SUMMARY OF THE INVENTION

A MIC process is provided which employs an a-Si film precursor deposited by physical vapor deposition (PVD), wherein the precursor film does not readily undergo crystallization by standard SPC processes. Using this PVD a-Si precursor, the a-Si film is transformed to p-Si by the MIC method wherein the crystalline growth occurs fastest at regions that have been augmented with a metal catalyst and proceeds extremely slowly, practically zero, at regions which bear no metal catalyst. Accordingly, by use of the PVD a-Si precursor in the process of the present invention, the MIC process may take place at higher annealing temperatures and shorter annealing times without SPC taking place. The process has a faster throughput than previous MIC processes, results in a p-Si film having virtually no catalyst impurities remaining in the film, and a film having spatially uniform characteristics.

DETAILED DESCRIPTION OF THE INVENTION

The present invention pertains to a process for the deposition of a thin film used in the fabrication of polysilicon thin film transistors (p-Si TFTs). One aspect of the invention is sputtering, or physical vapor deposition (PVD), as it applies to the deposition of amorphous silicon (a-Si). Another aspect of the invention is the combination of sputtered silicon with a metal catalyst to promote phase transformation of a-Si to p-Si, upon a thermal anneal. Another aspect of the present invention is a rapid thermal anneal (RTA) method to conduct the annealing step of the present invention. The thin films made by the combination of these processes are used in the fabrication of p-Si TFTs, which in turn are key elements of different types of liquid crystal displays (LCDs). Accordingly, the application area of the invention, or the devices made by the process of the present invention, consists of two broad categories: p-Si TFT devices and LCD devices.

Figure 1A:
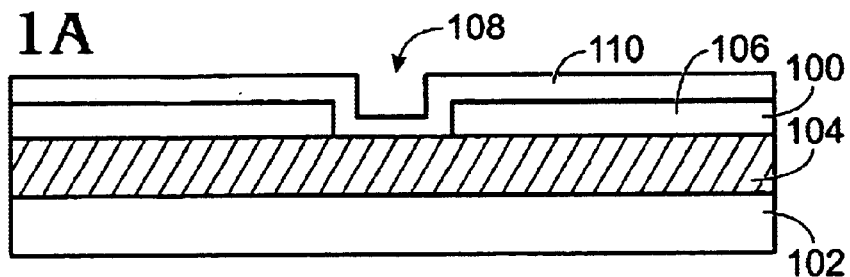
FIGS. 1A–D are a schematic depiction of the MIC process.

Referring now to the figures, FIGS. 1A–D show a schematic depiction of an MIC process. In particular, FIG. 1A shows a side cross-sectional view of a layered structure 100 having a substrate and base coat 102, an amorphous silicon layer 104 thereon (wherein the amorphous silicon layer is depicted with cross hatching for ease of illustration), and a silicon dioxide mask or barrier layer 106 with a window 108 therein. A catalyst 110 has been deposited on silicon dioxide layer 106 and in window 108. Accordingly, within window 108, the catalyst is in contact with a-Si layer 104.

As will be described in more detail herein, a-Si layer 104 is deposited on substrate 102 by physical vapor deposition. As will be understood by those skilled in the art, layer 104 may be "deposited on substrate 102" by depositing layer 104 on other layers which in turn are deposited on the substrate. Silicon dioxide layer 106 typically is deposited on a-Si layer 104 by standard methods as will be understood by those skilled in the art. Catalyst 110 typically comprises a metal catalyst such as aluminum, indium tin oxide, or a transition metal such as nickel, cobalt and palladium. In addition, germanium and other similar materials are also considered a "metal catalyst" for purposes of the metal induced crystallization process of the present invention. Catalyst layer 110 typically is deposited by standard deposition methods as will be understood by those skilled in the art. The catalyst may also be provided to the amorphous silicon film by other methods such as ion implantation/doping and spin on processes using liquid solutions.

Figure 1B:
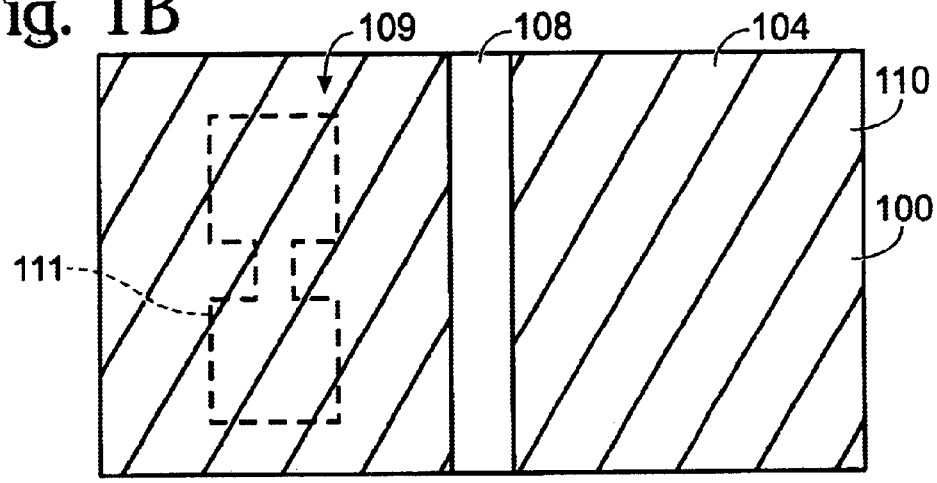

FIG. 1B shows a top view of layered structure 1100 wherein a thin film transistor 111 (shown in dash lines) is to be formed to the left of elongate window 108 in region 109. The cross hatching is shown in FIG. 1B, except in the window portion, to illustrate the extent of amorphous silicon layer 104. In the preferred embodiment, windows 108 will surround areas 109 where each TFT is to be fabricated so that the catalyst is not introduced uniformly into a-Si layer 104 but only at selected areas. Nucleation and crystalline growth in a-Si layer 104 will commence from these window areas first. As the crystalline fronts develop from the sites where the catalyst has been introduced, the fronts propagate forward and crystallize sufficiently large regions to enable fabrication of each TFT device. Outside these regions the silicon material can remain in the amorphous phase since it will be etched away, i.e., removed, in subsequent steps. TFT 111 may comprise any known TFT device.

Figure 1C:
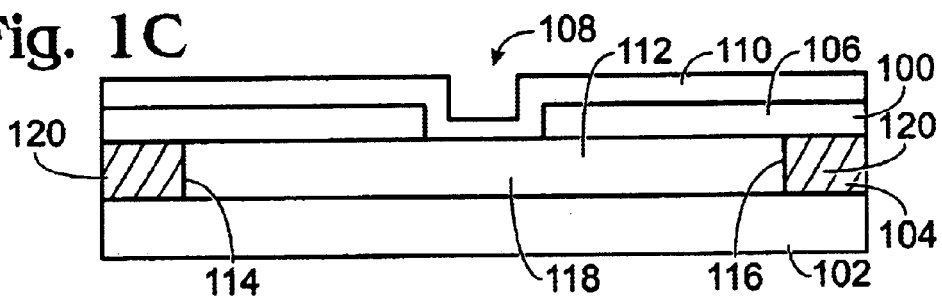

FIG. 1C shows a side cross-sectional view of layered structure 100 after an annealing step. Due to the metal catalyst in layer 110, a portion 112 of a-Si layer 104 has crystallized outwardly from window 108 to crystalline fronts 114 and 116. This forms a p-Si region 118 (indicated without cross hatching for ease of illustration in distinguishing the p-Si region from the a-Si region). Regions 120 (shown cross hatched) of layer 104 which remain in the amorphous phase will be etched away in subsequent steps.

Figure 1D:
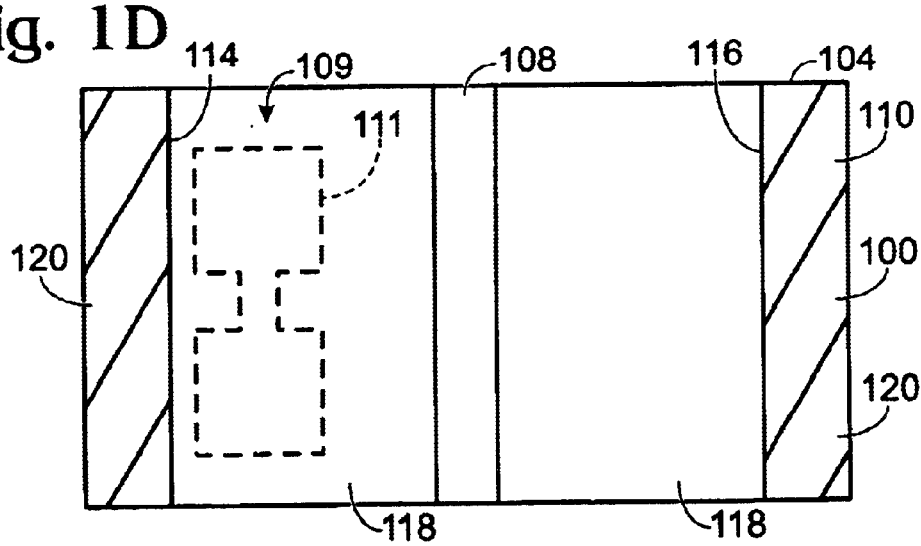

FIG. 1D shows a top view of layered structure 100 after the annealing step wherein crystalline fronts 114 and 116 have moved outwardly from window 108 so that area 109 in which TFT 111 will be fabricated is contained within p-Si region 118.

Figure 2A:
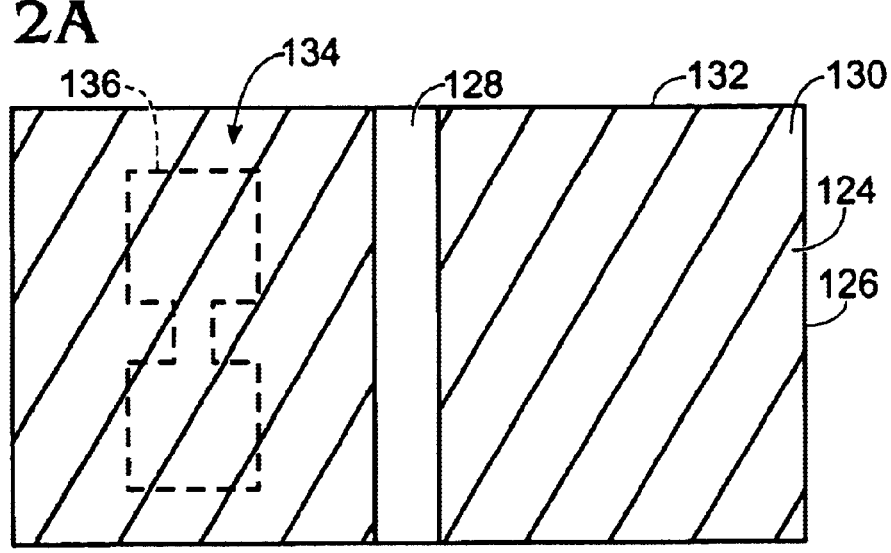
FIGS. 2A–D are a schematic depiction of a pure MIC process compared with a combined partial SPC and MIC process.

FIGS. 2A–D show schematic depictions of a pure MIC process compared with a combined partial SPC and MIC process. In particular, FIG. 2A shows a top view of a layered structure 124 similar to that of structure 100. Structure 124 includes a silicon dioxide barrier layer 126 having a window 128 formed therein. A metal catalyst 130 is deposited on an upper surface of layer 126 and in window 128 such that the catalyst is in contact with an a-Si layer 132 positioned beneath barrier layer 126 (the extent of a-Si layer 132 is shown in cross hatching for ease of illustration even though the a-Si layer is typically positioned beneath barrier layer 126 and catalyst layer 130). Layer 132 includes an area 134 for the formation of a TFT 136, indicated by dash lines.

Figure 2B:
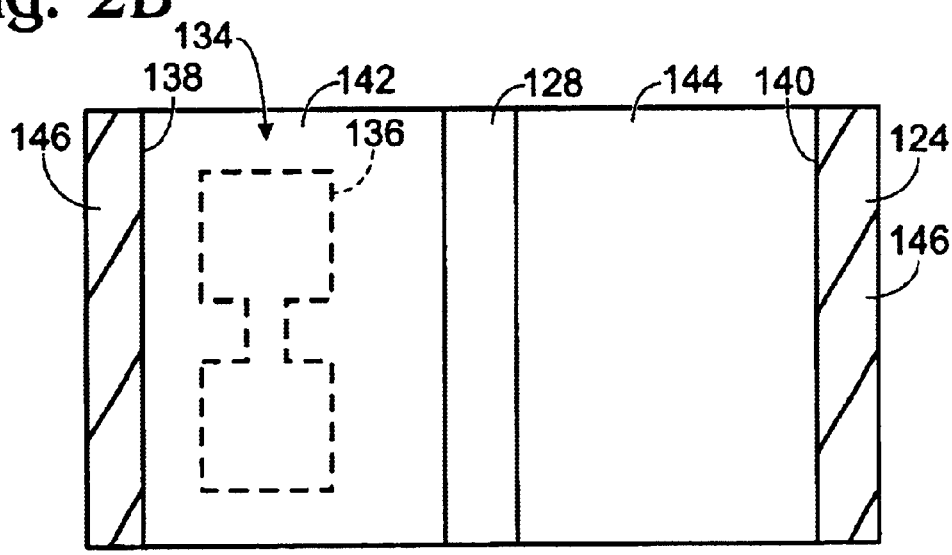

FIG. 2B shows a top view of layered structure 124 after an annealing step wherein crystalline fronts 138 and 140 have moved outwardly from window 128 to form p-Si regions 142 and 144 (shown without cross hatching). In this manner the area 134 in which TFT 136 will be fabricated is contained within p-Si region 142. The portion of original layer 132 which has transformed to p-Si regions 142 and 144 has transformed solely by the MIC process. Accordingly, regions 142 and 144 have uniform material characteristics across the region and include virtually no catalyst within the p-Si layer. The portions 146 of original layer 132 not contained within p-Si regions 142 and 144 remain in the amorphous state (shown as cross hatched for ease of illustration). The layered structure of FIG. 2B is the desirable product of the present invention.

For purposes of the present invention, the term "uniform material characteristics" is defined as at least 90% of the film having virtually identical chemical and mechanical characteristics. Accordingly, in a film having uniform material characteristics, less than 10% of the film will have different chemical and material characteristics from the remainder or the film, wherein the 10% of the film with differing characteristics typically is a result of the pockets or islands of crystallization which form within the MIC region by the method of partial SPC. The process of the present invention is believed to result in a film having virtually identical chemical and mechanical characteristics across approximately 99% of the film.

Figure 2C:
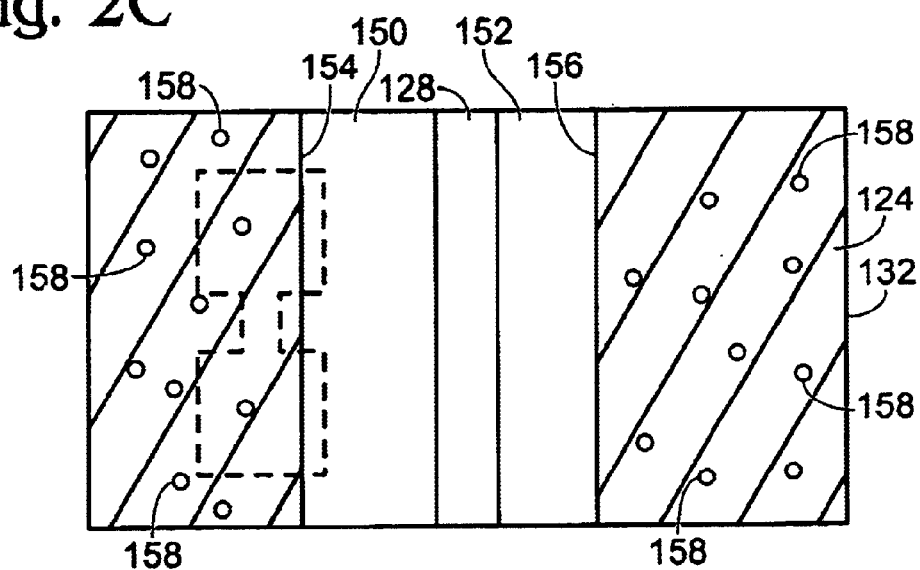

FIG. 2C shows a top view of layered structure 124 after an annealing step wherein the amorphous silicon layer is transformed to polysilicon by the combined processes of MIC and partial SPC. In particular, portions 150 and 152 of a-Si layer 132 adjacent window 128 have undergone transformation from the amorphous phase to the crystalline phase as represented by crystalline fronts 154 and 156. In addition, a-Si layer 132 has undergone partial SPC at discrete areas 158 scattered throughout a-Si layer 132.

Figure 2D:
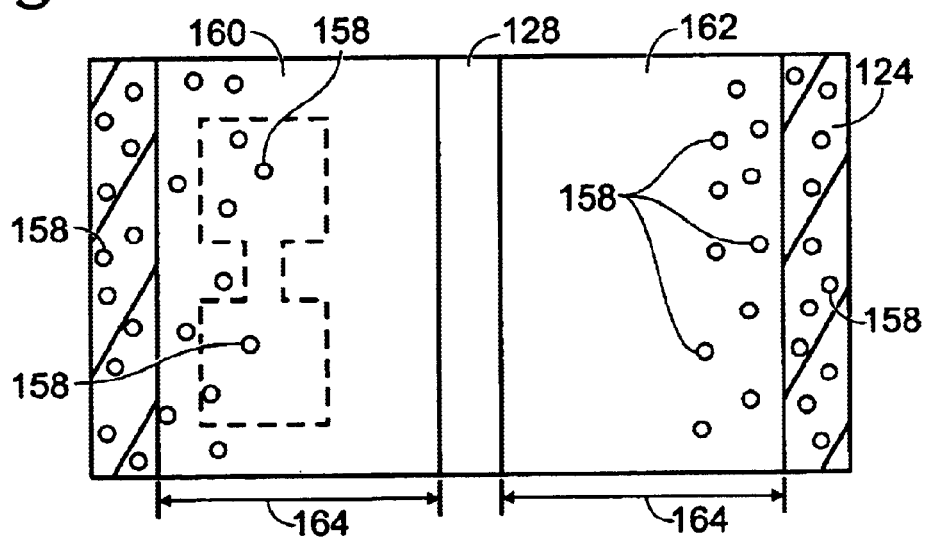

FIG. 2D shows a top view of layered structure 124 after completion of the MIC and the partial SPC transformation process of the a-Si layer. Regions 160 and 162 of the original a-Si layer have been transformed to the crystalline phase by partial SPC at areas 158 and by MIC at all other areas within regions 160 and 162. Accordingly, regions 160 and 162 will have varying material characteristics throughout the regions, resulting in variations in the TFT device performance. The layered structure of FIG. 2D is the undesirable product of the prior art processes.

Still referring to FIG. 2D, partial SPC typically tends to appear either at high crystallization temperatures, i.e., temperatures greater than 700, CC, or long crystallization times, i.e., greater than 200 seconds when an amorphous silicon film deposited by chemical vapor deposition (CVD), i.e., the precursor films of the prior art, are subjected to annealing. Crystallization by the pure MIC process, without partial SPC, has heretofore not been achievable at temperatures greater than 700° C. with anneal times greater than 200 seconds for films deposited by CVD. Moreover, at crystallization temperatures over 700° C., lateral growth lengths 164, i.e., the distance from window 128 across regions 160 and 162, of the crystalline growth fronts greater than approximately 77 $\mu$m have not been achievable.

Figure 3:
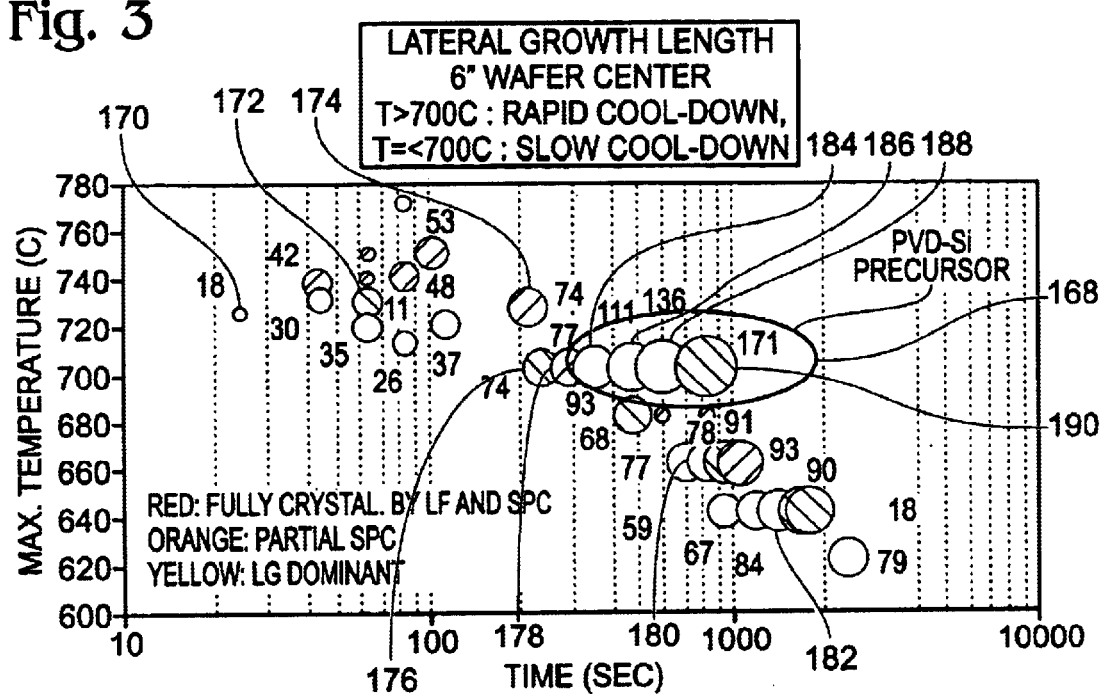
FIG. 3 is a graph showing the lateral growth length in example films for certain annealing temperatures and annealing times for combined partial SPC and MIC processes and for the pure MIC process of the present invention using a PVD a-Si precursor film.

FIG. 3 is a graph showing the lateral growth length in example films for certain annealing temperatures and annealing times for both combined partial SPC/MIC processes and for the pure MIC process of the present invention. In particular, the bubbles shown within oval 168 represent the results of crystallization utilizing the PVD a-Si precursor films of the present invention. The bubbles shown outside oval 168 represent the result of crystallization utilizing the chemical vapor deposited (CVD) a-Si films of the prior art processes. The two dimensional plot of crystallization temperature versus crystallization time indicates the onset of partial SPC at the different combinations of temperature and time for these different films. In addition, the plot shows the lateral growth length at particular temperatures and annealing times, wherein the lateral growth length is defined as the extent that the crystalline growth front advances before it stops due to the depletion of the catalyst originally deposited in the introduction window. As described above, the lateral growth length is maximized at long annealing times and/or higher annealing temperatures. These desired temperatures and annealing times, however, are also the conditions which in the prior art have produced undesirable crystallization through the partial SPC process.

Still referring to FIG. 3, the clear bubbles indicate crystallization by the pure MIC process, i.e., a lack of crystallization by the partical SPC process. "Pure MIC" is defined as crystallization by the MIC method in at least 90% of the film region, so that at most 10% of the film region has crystallized by the partial SPC process. However, the process of the present invention is believed to result in polysilicon films having approximately 99% crystallization by the MIC method. The vertically cross hatched bubbles indicate crystallization by a combination of partial SPC and MIC processes. The horizontally cross hatched bubbles indicate significant crystallization by the SPC process.

In particular, clear bubble 170 indicates crystallization of a CVD film by the pure MIC process at a temperature of approximately 720° C. with an anneal time of approximately 25 seconds, wherein the crystalline growth length is approximately 18 $\mu$m. These process variables typically are not feasible for use with glass substrates because the glass may deform at this temperature. Moreover, a crystalline growth length of only 18 $\mu$m will typically result in much of the catalyst being left in the film, which reduces the quality of the resulting device.

Lateral growth lengths of 50 $\mu$m or more are desirable and result in some catalyst remaining in the film whereas lateral growth lengths of 80 $\mu$m or more are the more desirable growth lengths and result in virtually all the catalyst being depleted within the film. As a general rule, the greater the growth length of the crystalline front, the greater the amount of catalyst that is depleted. However, the growth length and the amount of catalyst remaining in the film is related to the type of catalyst used, the amount of catalyst initially placed in the silicon film, and the process variables of the annealing process.

Vertically cross hatched bubble 172 indicates crystallization of a CVD film by the combined partial SPC/MIC processes at a temperature of approximately 730° C. with an anneal time of approximately 65 seconds, wherein the crystalline growth length is approximately 44 μm. These process variables typically are not feasible for use with glass substrates because the glass may deform at this temperature. Moreover, a crystalline growth length of only 44 μm will typically result in catalyst left remaining the film, which reduces the quality of the resulting device. Moreover, the mixed crystallization by the combined SPC/MIC processes will result in undesirable varied material characteristics spatially within the film.

Horizontally cross hatched bubble 174 indicates significant crystallization of a CVD film by the SPC process at a temperature of approximately 725° C. with an anneal time of approximately 200 seconds, wherein the crystalline growth length is approximately 74 μm. These process variables typically are not feasible for use with glass substrates because the glass may deform at this temperature. Moreover, a crystalline growth length of only 74 μm will typically result in some catalyst left remaining the film, which reduces the quality of the resulting device. Furthermore, the significant crystallization by the SPC process will result in substantial undesirable varied material characteristics spatially within the film.

At the slightly lower temperature of 700° C., which will not typically result in the deformation of a glass substrate, anneal times of at least 200 seconds are required using the CVD films of the prior art. This combination of conditions in the prior art results in crystallization by the SPC process. In particular, vertically cross hatched bubble 176 indicates crystallization of a CVD film by the combined partial SPC/MIC processes at a temperature of approximately 700° with an anneal time of approximately 250 seconds, wherein the crystalline growth length is approximately 74 μm. This growth length of only 74 μm will typically result in some catalyst left remaining the film, which reduces the quality of the resulting device. Moreover, the mixed crystallization by the combined SPC/MIC processes will result in undesirable varied material characteristics spatially within the film.

Horizontally cross hatched bubble 178 indicates significant crystallization of a CVD film by the SPC process at a temperature of approximately 700° C. with an anneal time of approximately 300 seconds, wherein the crystalline growth length is approximately 77 μm. This growth length of only 77 μm will typically result in some catalyst left remaining the film, which reduces the quality of the resulting device. Moreover, the significant crystallization by the SPC process will result in significant undesirable varied material characteristics spatially within the film.

Clear bubble 180 indicates crystallization of a CVD film by the pure MIC process at a temperature of approximately 660° C. with an anneal time of approximately 700 seconds, wherein the crystalline growth length is approximately 77 μm. These process variables typically are feasible for use with glass substrates because the glass typically will not deform at this temperature. However, a crystalline growth length of only 77 μm will typically result in some catalyst left remaining the film, which reduces the quality of the resulting device. Moreover, an annealing time of approximately 700 seconds limits the throughput of the process.

Clear bubble 182 indicates crystallization of a CVD film by the pure MIC process at a temperature of approximately 640° C. with an anneal time of approximately 1100 seconds, wherein the crystalline growth length is approximately 84 μm. These process variables are feasible for use with glass substrates because the glass typically will not deform at this temperature. In addition, a crystalline growth length of 84 μm will typically result in virtually no catalyst left remaining the film, which increases the quality of the resulting device. However, an annealing time of approximately 1100 seconds substantially limits the throughput of the process. Accordingly, clear bubble 182 indicates the fastest prior art process available for producing a film with the desired characteristics.

In contrast, clear bubble 184 indicates crystallization of a PVD film of the present invention by the pure MIC process at a temperature of approximately 700° C. with an anneal time of approximately 350 seconds, wherein the crystalline growth length is approximately 93 μm. These process variables typically are feasible for use with glass substrates because the glass generally will not deform at this temperature. Moreover, a crystalline growth length of approximately 93 μm will typically result in virtually no catalyst left remaining the film, which increases the quality of the resulting device compared to devices in which catalyst is left remaining in the film. An annealing time of 350 seconds for the film of the present invention is approximately one third the throughput time of the prior art processes, wherein an acceptable film is produced with an anneal of approximately 1100 seconds. In addition, the process indicated by clear bubble 184 results in a crystallization growth length of 93 μm, which is a growth length approximately ten percent longer than the 84 μm growth length of the film produced by the process of the prior art.

Similarly, clear bubble 186 indicates crystallization of a PVD film of the present invention by the pure MIC process at a temperature of approximately 700° C. with an anneal time of approximately 500 seconds, wherein the crystalline growth length is approximately 111 μm. These process variables typically are feasible for use with glass substrates because the glass generally will not deform at this temperature. Moreover, a crystalline growth length of approximately 111 μM will typically result in no catalyst left remaining the film, which increases the quality of the resulting device compared to devices in which catalyst is left remaining in the film. An annealing time of 500 seconds for the film of the present invention is approximately one half the throughput time of the prior art processes, wherein an acceptable film is produced with an anneal of approximately 1100 seconds. In addition, the process indicated by clear bubble 186 results in a crystallization growth length of 111 μm, which is growth length approximately thirty percent longer than the 84 μm growth length of the film produced by the process of the prior art.

Still referring to FIG. 3, clear bubble 188 indicates crystallization of a PVD film of the present invention by the pure MIC process at a temperature of approximately 700° C. with an anneal time of approximately 600 seconds, wherein the crystalline growth length is approximately 136 μm. These process variables typically are feasible for use with glass substrates because the glass generally will not deform at this temperature. Moreover, a crystalline growth length of approximately 136 μm will result in no catalyst left remaining the film, which increases the quality of the resulting device compared to devices in which catalyst is left remaining in the film. An annealing time of 600 seconds for the film of the present invention is approximately one half the throughput time of the prior art processes, wherein an acceptable film is produced with an anneal of approximately 1100 seconds. In addition, the process indicated by clear bubble 188 results in a crystallization growth length of 136

μm, which is growth length approximately sixty percent longer than the 84 μm growth length of the film produced by the process of the prior art.

Vertically cross hatched bubble 190 indicates crystallization of a PVD film of the present invention by the combined partical SPC and MIC processes at a temperature of approximately 700° C. with an anneal time of approximately 850 seconds, wherein the crystalline growth length is approximately 171 μm. These process variables typically are feasible for use with glass substrates because the glass generally will not deform at this temperature. Moreover, a crystalline growth length of approximately 171 μm will result in no catalyst left remaining the film, which increases the quality of the resulting device compared to devices in which catalyst is left remaining in the film. An annealing time of 850 seconds for the film of the present invention is less than the throughput time of the prior art processes, wherein an acceptable film is produced with an anneal of approximately 1100 seconds. Crystallization by the combined SPC/MIC method, however, is unacceptable.

Accordingly, the process of the present invention which utilizes a physical vapor deposited a-Si film that is subjected to an anneal at a temperature of up to 700° C., will produce a film by the pure MIC process, while suppressing partial SPC, for anneal times up to approximately 850 seconds. In other words, by using the process of the present invention, the window of anneal temperatures is increased to at least 700° C., and the window of anneal times is increased to approximately 850 seconds, while suppressing partial SPC. Moreover, by using the process of the present invention, a TFT device, which may be utilized in an LCD, is fabricated from a silicon film which has superior lateral growth length characteristics, superior spatial material characteristics, and faster throughput processing capabilities, than the processes and devices of the prior art. In other words, the PVD precursor film of the present invention is resilient to partial SPC growth even after approximately 700 seconds at 700° C. (as shown by bubble 188), whereas partial SPC dominates the growth in plasma enhanced chemical vapor deposited silicon (PECVD-Si) films after only 200 seconds at 700° C. (as shown by bubble 176). This result implies that higher crystallization temperatures can be safely used with PVD-Si precursors to decrease crystallization times, preserve lateral growth lengths, and to suppress undesirable partial SPC phenomena in PVD films. Therefore, use of the PVD-Si precursor film of the present invention allows either longer crystallization times at a given temperature or higher crystallization temperatures for a given anneal time to achieve a sufficient lateral growth length without allowing partial SPC to take place.

The process of producing the PVD-Si precursor film and the film's physical properties will now be described. The a-Si precursor of the present invention is an a-Si film deposited using physical vapor deposition (PVD). In other words, PVD technology is utilized for the formation of the thin silicon film that is used as the active layer of the ITT device. This type of silicon material is very difficult to crystallize by SPC alone, due to the way in which the film is deposited. When silicon is sputtered, two phenomena occur which relate to the physical properties of the film. First, silicon atoms arrive on the surface of the forming films having a higher energy than in relevant, chemical deposition methods. This energy is imparted to the film creating collision cascades and resulting in structural damage to the film. This structural damage is similar to the damage experienced by a film subjected to ion implantation. However, the amount of damage to the film during PVD is lower than during ion implantation due to the lower energy of the arriving silicon species during PVD. Second, energetic neutral atoms of the plasma forming gas reflected from the target reach the film and also impart their energy and contribute to the structural changes in the film. As a result of these two phenomena, the structural disorder in the film increases, making it particularly difficult to form stable nuclei and commence solid phase crystalline growth when the film is subjected to a thermal anneal. Surprisingly, however, the structural disorder in the film does not prohibit crystallization by the method of metal induced crystallization.

This phenomena can be enhanced by increasing the deposition rate of the silicon film. Sputtering allows for significant increases in the deposition rate of the silicon without any detrimental effects common to the chemical vapor deposition methods, i.e., gas phase reactions, uniformity loss, and the like, of the prior art. Accordingly, the PVD-Si method of the present invention is particularly suited to reduce the rate at which solid phase crystallization of silicon occurs when the silicon thin film is subjected to a thermal anneal.

One way to correlate crystalline growth during a thermal anneal is by controlling the content of the sputtering gas used to apply the PVD silicon film. This content varies mainly with respect to the process pressure. The most commonly used sputtering gas is Argon (Ar), even though other inert gases such as Helium, Krypton and Neon may also be used in the present invention. When Argon is used as the sputtering gas, solid phase crystalline growth rates have been found to be reduced by one to two orders of magnitude, compared to Argon-free samples, even at Argon concentrations as low as 0.2 atomic percent (0.2 at %), defined as $1 \times 10^{20}$ atoms per square centimeter (1 e20 at/cm$^2$).

Figure 4:
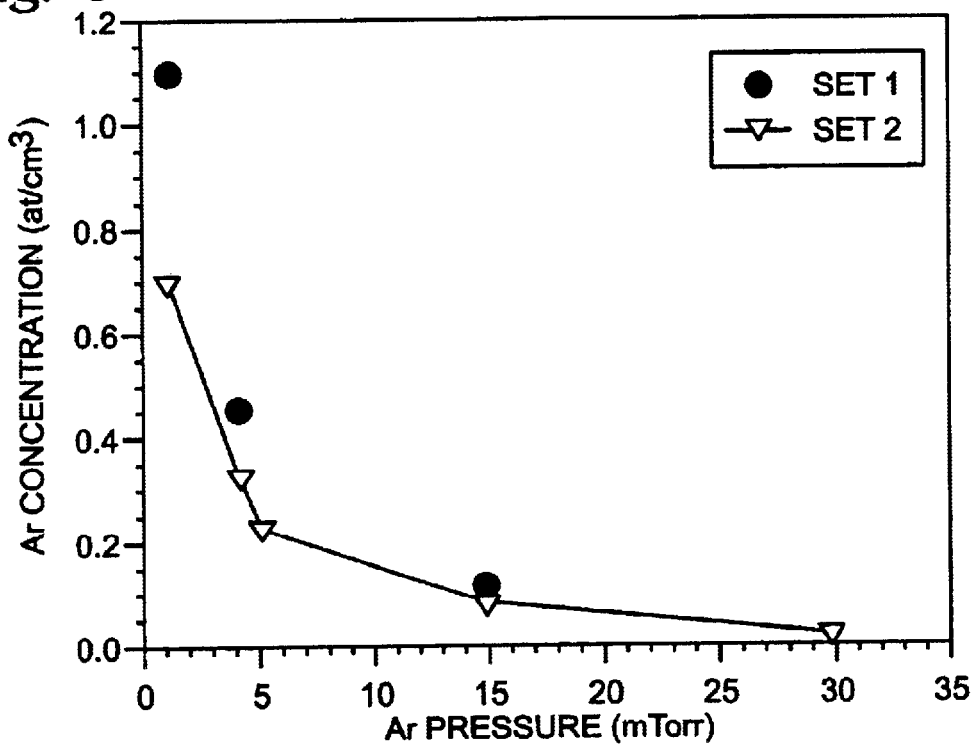
FIG. 4 is a graph showing incorporation of the sputtering gas in the silicon film as a function of the sputtering pressure.

The concentration of the sputtering gas incorporated into the film during deposition can be controlled by the sputtering pressure and the composition of the gas. Referring to FIG. 4, the figure shows a graph illustrating the incorporation of Argon as the sputtering gas in the deposited film as a function of the Argon sputtering gas pressure.

As shown in the figure, increasing the pressure of the sputtering gas decreases the concentration of the Argon in the film.

Figures 5, 6:
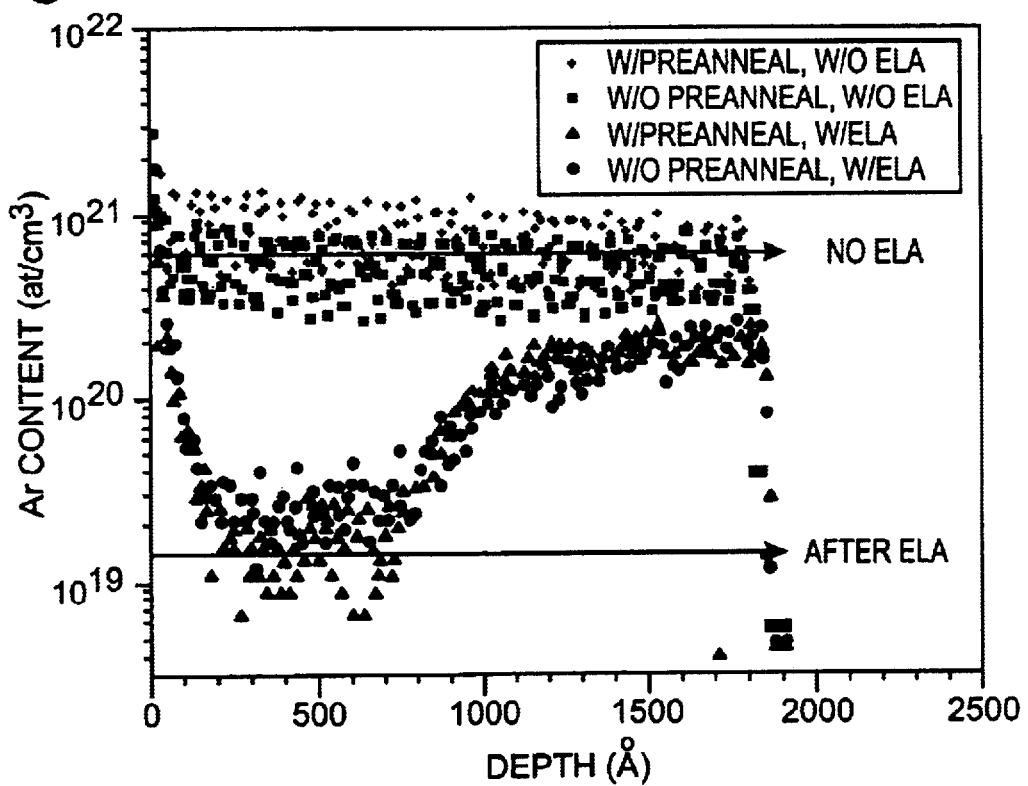
FIG. 5 is a table showing incorporation of the sputtering gas in the film as a function of the sputtering gas composition.
FIG. 6 is a graph showing incorporation of the sputtering gas in a film before and after excimer laser annealing treatment.

FIG. 5 is a table showing the incorporation of the sputtering gas in the deposited film as a function of the sputtering gas composition. As shown in the figure, when the sputtering gas is pure Helium, the Argon content in the deposited film is less than $2 \times 10^{18}$ at/cm$^3$, at a pressure of approximately 14–16 mTorr. When the sputtering gas is pure Argon, the Argon content in the deposited film is approximately $6 \times 10^9$ at/cm$^3$, at a pressure of approximately 14–16 mTorr. At a lower pressure of 5–6 mTorr with a pure Argon sputtering gas, the Argon content in the deposited film is approximately $2 \times 10^{20}$ at/cm$^3$. Accordingly, by changing the pressure of the sputtering gas, the Argon content in the sputtered silicon film can be changed by an order of magnitude.

In addition, incorporation of the inert gas in the deposited film can be reduced by subsequent thermal treatments, after deposition of the film. These subsequent thermal treatments release the inert gas that typically is trapped in the film in the form of micro-bubbles. The thermal treatments, however, may not be beneficial in restoring the film's microstructural quality since the damage to the film has already been done. One exception to this general rule may be the case of excimer laser annealing (ELA) treatments. The ELA process locally melts the silicon film and simultaneously allows Argon trapped in the film to escape. Accordingly, the microstructure of the post-ELA film can be sufficiently repaired if the Argon content in the pre-ELA film is sufficiently low so that most of the Argon can escape during the ELA procedure.

FIG. 6 is a graph showing the incorporation of Argon in the thin film, when Argon is used as the sputtering gas, before and after an excimer laser annealing treatment, with and without pre-anneal processing. The annealing processes of the graph were conducted at 450° C. for three hours. The data shown in the figure is based on films that have no catalyst included therein and therefore the graph is used generally to illustrate the effect of ELA treatment.

As shown in the figure, a mild anneal, i.e., an anneal at a temperature of approximately 450° C. for 3 hours, before the ELA treatment, has no effect on the Argon content in the post-ELA film. This indicates the need for higher temperature anneals which will enable out-diffusion of trapped Argon, or other sputtering gases, in the deposited films.

Figure 7:
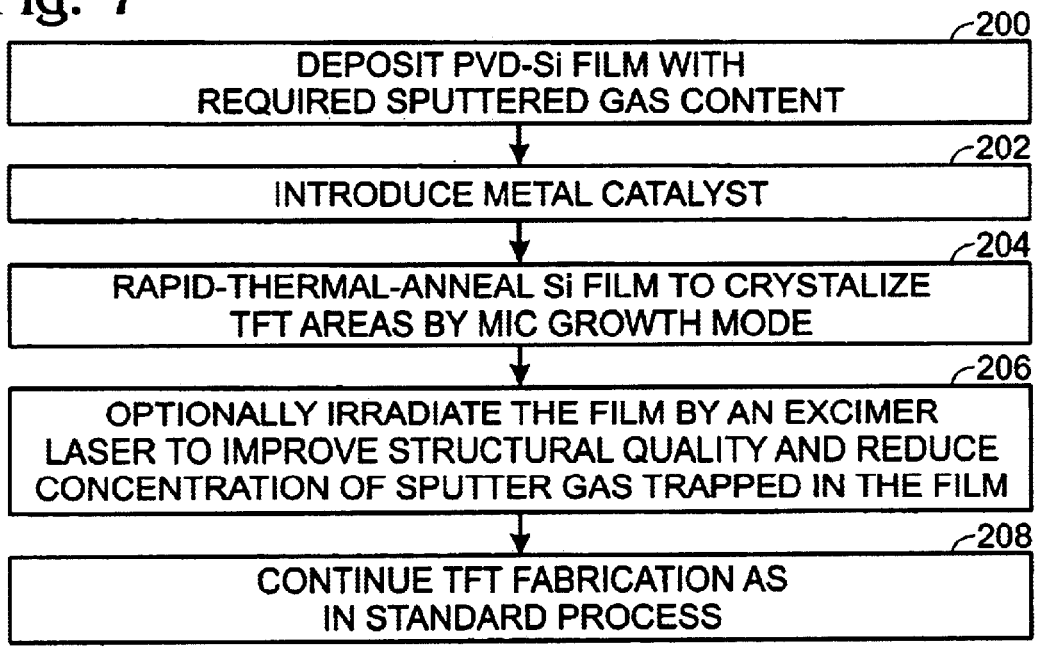
FIG. 7 is a flow diagram illustrating steps of the method of the present invention.

FIG. 7 is a flow diagram illustrating steps of the method of the present invention. In particular, the process of the present invention comprises a first step 200 including depositing by physical vapor deposition an amorphous silicon film, with a required sputtering gas content, on a substrate. The sputtering gas typically will comprise a single inert gas, such as Argon, or a combination of inert gases, preferably including Argon, and will be provided at a pressure between one and thirty mTorr, and preferably between five and sixteen mTorr. The power supplied during the deposition step typically is 8 kWatts. The thickness of the deposited layer and other characteristics of the silicon film can be adapted for the particular purposes for which the silicon film is eventually utilized.

After physical vapor deposition of the amorphous silicon film, a barrier layer including a window therein typically is deposited on the silicon film. The window typically will allow contact of a catalyst with the silicon film at the predetermined location. A barrier layer may not be deposited on the silicon film if the catalyst is introduced directly along the length of the silicon film over an entire crystallization region.

Step 202 includes introducing a catalyst to the PVD-Si film. The catalyst typically will comprise a "metal catalyst" such as aluminum, indium tin oxide, nickel, cobalt, palladium or germanium. The metal catalyst typically is placed in contact with the silicon film at a location adjacent to an area in which a thin film transistor is to be fabricated. In one embodiment the metal catalyst is introduced to the silicon film by deposition on a barrier layer wherein the catalyst contacts the silicon film through one or more windows in the barrier layer.

Step 204 comprises conducting a rapid thermal anneal of the PVD-Si film to crystallize the TFT regions of the film by the process of MIC growth mode, while the properties of the PVD-Si film suppress crystallization of the film by the partial SPC process. As recited above, due to the structural disorder of silicon film deposited by PVD, the film suppresses SPC during the annealing process so that the film is crystallized by pure MIC. The rapid thermal anneal may take place at any temperature and time conditions as desired. However, in the method of the present invention, the rapid thermal anneal may take place at temperatures of approximately 700° C. for a time period of approximately 700 seconds, which results in a film having uniform material characteristics across the film, virtually no catalyst left remaining in the film, and faster throughput times than the processes of the prior art.

An optional step 206 comprises irradiating the annealed film with an excimer laser to improve the structural quality and to reduce the concentration of the sputtered gas which may be trapped in the film. In particular, the ELA treatment improves the structural quality of the film by locally melting regions of the film and reduces the concentration of the sputtering gas retained in the film by allowing the trapped gas to leave the film in the form of microbubbles.

Step 208 comprises further fabrication of the TFT as is known in the art.

Thus, methods of forming a TFT film having improved quality over films of the prior art, and the structure itself, have been disclosed. Although preferred methods of forming the structure have been disclosed, it should be appreciated that further variations and modifications may be made thereto without departing from the scope of the invention as defined in the appended claims.

We claim:

1. A method of fabricating a polysilicon film, comprising the steps of:
   providing a substrate;
   depositing an amorphous silicon film on the substrate by the process of physical vapor deposition;
   introducing a metal catalyst to the previously deposited amorphous silicon film;
   annealing the amorphous silicon film; and,
   in response to the annealing, suppressing partial solid phase crystallization (SPC) in the amorphous silicon film.

2. The method of claim 1 further comprising the step of utilizing the crystallized region in a liquid crystal display.

3. The method of claim 1 wherein the amorphous silicon film is deposited using Argon as a sputtering gas, and wherein the Argon content in the amorphous silicon film after the deposition step is in the a range of $2 \times 10^{18}$ at/cm$^3$ to $5 \times 10^{21}$ at/cm$^3$.

4. The method of claim 1 wherein the amorphous silicon film is deposited using Argon as a sputtering gas, and wherein the Argon content in the crystallized region after the annealing step is in the range of $2 \times 10^{18}$ at/cm$^3$ to $5 \times 10^{21}$ at/cm$^3$.

5. The method of claim 1 wherein the annealing step is conducted at a temperature greater than 650° C. and for a time period greater than 200 seconds.

6. The method of claim 1 further comprising the step of providing a barrier layer on said amorphous silicon film wherein said barrier layer includes a window therein for the introduction of said catalyst to said amorphous silicon film.

7. The method of claim 1 wherein said metal catalyst is chosen from the group consisting of aluminum, indium tin oxide, nickel, cobalt, palladium and germanium.

8. The method of claim 1 further comprising the step of metal-induced crystallizing the amorphous silicon film, forming a metal induced crystallized region, in response to the annealing.

9. The method of claim 1 wherein depositing an amorphous silicon film on the substrate by the process of physical vapor deposition includes structurally damaging the deposited amorphous silicon film; and,
   wherein suppressing partial SPC in the amorphous silicon film includes suppressing partial SPC in response to the structurally damaged amorphous silicon film.

10. The method of claim 8 further comprising the step of irradiating the crystallized region with an excimer laser after the step of annealing the amorphous silicon film.

11. The method of claim 8 further comprising the step of fabricating a thin film transistor in the crystallized region.

12. The method of claim 8 wherein forming the crystallized region includes producing a crystallization growth front length of at least 80 μm.

13. The method of claim 8 further comprising the step of, in response to metal-induced crystallizing the amorphous silicon film, entirely consuming the metal catalyst.

14. A method of fabricating a polysilicon film, comprising the steps of:

provide a substrate;

depositing an amorphous silicon film on the substrate by the process of physical vapor deposition;

in a separate step from the deposition of said amorphous silicon film, depositing a metal catalyst film on the amorphous silicon film;

annealing the amorphous silicon film and the metal catalyst film at a temperature greater than 650° C. and for a time period greater than 200 seconds and less than 800 seconds;

metal-induced crystallizing the amorphous silicon film; and, simultaneously with the metal-induced crystallizing, suppressing partial solid phase crystallization (SPC) in the amorphous silicon film.

15. A method of fabricating a polysilicon film, comprising the steps of:

providing a substrate:

depositing an amorphous silicon film on the substrate by the process of physical vapor deposition;

after deposition of said amorphous silicon film, depositing a metal catalyst film on selected regions of the amorphous silicon film;

annealing the amorphous silicon film and the metal catalyst film;

metal-induced crystallizing amorphous silicon film in said selected regions; and, simultaneously with the metal-induced crystallizing, suppressing partial solid phase crystallization (SPC) of the amorphous silicon film in said elected regions.

* * * * *